(12) United States Patent
Krummacher et al.

(10) Patent No.: US 8,253,155 B2  
(45) Date of Patent: Aug. 28, 2012

(54) RADIATION-EMITTING DEVICE

(75) Inventors: Benjamin Claus Krummacher, Regensburg (DE); Florian Schindler, Traunstein (DE); Markus Klein, Tegernheim (DE)

(73) Assignee: OSRAM Opto Semiconductors GmbH, Regensburg (DE)

(*) Notice: Subject to any disclaimer, the term of this patent is extended or adjusted under 35 U.S.C. 154(b) by 177 days.

(21) Appl. No.: 12/677,085

(22) PCT Filed: Aug. 12, 2008

(86) PCT No.: PCT/DE2008/001329  
§ 371 (c)(1),  
(2), (4) Date: Apr. 21, 2010

(87) PCT Pub. No.: WO2009/033444  
PCT Pub. Date: Mar. 19, 2009

(65) Prior Publication Data  
US 2010/0193818 A1    Aug. 5, 2010

(30) Foreign Application Priority Data  
Sep. 10, 2007  (DE) .................. 10 2007 043 099  
Dec. 5, 2007   (DE) .................. 10 2007 058 453

(51) Int. Cl.  
*H01L 33/00*  (2010.01)  
*H01J 63/04*  (2006.01)

(52) U.S. Cl. .................. 257/98; 257/E33.067; 313/506

(58) Field of Classification Search ............ 257/98.99, 257/E33.067; 313/483, 504, 506  
See application file for complete search history.

(56) References Cited

U.S. PATENT DOCUMENTS

| | | |
|---|---|---|
| 6,833,667 B2 | 12/2004 | Hamano et al. |
| 2003/0164679 A1 | 9/2003 | Hamano et al. |
| 2005/0231085 A1 | 10/2005 | Song et al. |
| 2006/0214572 A1 | 9/2006 | Maeda |
| 2006/0290272 A1 | 12/2006 | Haenichen |
| 2007/0085476 A1 | 4/2007 | Hirakata et al. |
| 2007/0205418 A1 | 9/2007 | Takahashi |
| 2008/0018231 A1 | 1/2008 | Hirakata |

FOREIGN PATENT DOCUMENTS

| | | |
|---|---|---|
| EP | 1 589 584 A2 | 10/2005 |
| EP | 1 830 421 A2 | 9/2007 |
| JP | 10 172756 A | 6/1998 |
| WO | WO-02/41406 A1 | 5/2002 |

OTHER PUBLICATIONS

Refractive Index SiO2—at hhtp://refractiveindex.info/ Date = Dec. 1, 2011.*

(Continued)

*Primary Examiner* — A. Sefer  
*Assistant Examiner* — Nikolay Yushin  
(74) *Attorney, Agent, or Firm* — Slater & Matsil, L.L.P.

(57) ABSTRACT

A radiation-emitting device has a radiation-emitting component with a layer stack with an active region that is formed for the emission of electromagnetic radiation. A microstructure layer is mechanically coupled to the layer stack and has elevations that extend away from the layer stack. A protective layer has a planar side facing away from the microstructure layer and is arranged on a side of the microstructure layer facing away from the layer stack.

18 Claims, 2 Drawing Sheets

OTHER PUBLICATIONS

Gu, G., et al., "High-External-Quantum-Efficiency Organic Light-Emitting Devices," Optics Letters, Mar. 15, 1997, pp. 396-398, vol. 22, No. 6, Optical Society of America, Washington D.C., United States.

Jordan, R. H., et al., "Efficiency Enhancement of Microcavity Organic Light Emitting Diodes," Applied Physics Letters, Sep. 1996, pp. 1997-1999, vol. 69, No. 14, American Institute of Physics, Argonne, Illinois, United States.

Lu, M.-H., et al., "Improved External Coupling Efficiency in Organic Light-Emitting Devices on High-Index Substrates," International Electron Devices Meeting 2000, IEDM Technical Digest International, Dec. 2000, pp. 25.1.1-25.1.4, IEEE, San Francisco, California, United States.

Lupton, J.M., et al., "Bragg Scattering From Periodically Microstructured Light Emitting Diodes," Applied Physics Letters, Nov. 20, 2000, pp. 3340-3342, vol. 77, No. 21, American Institute of Physics, Argonne, Illinois, United States.

Peng, H.J., et al., "Coupling Efficiency Enhancement of Organic Light Emitting Devices with Refractive Microlens Array on High Index Glass Substrate," SID Symposium Digest of Technical Papers, May 2004, pp. 158-161, vol. 35, No. 1, The Society of Information Display, San Jose, California, United States.

Salt, M.G., et al., "Photonic Band Structure and Emissive Characteristics of MEH-PPV Textured Microcavities," Journal of Modern Optics, May 2001, pp. 1085-1098, vol. 48, No. 6, Taylor & Francis, Ltd., United Kingdom.

Scheffel, M., et al., "Enhanced Light Extraction by Substrate Modification of Organic Electroluminescent Devices," Proceedings of the European Conference on Organic Electronics and Related Phenomena 2001, Nov. 2001, pp. 158-159, University of Potsdam, Institute of Physics, Potsdam, Germany.

Shiang, J.J., et al., "Experimental Demonstration of Increased Organic Light Emitting Device Output via Volumetric Light Scattering," Journal of Applied Physics, Mar. 2004, pp. 2889-2895, vol. 95, No. 5, American Institute of Physics, Argonne, Illinois, United States.

Tsutsui, T., et al., "Doubling Coupling-Out Efficiency in Organic Light-Emitting Devices Using a Thin Silica Aerogel Layer," Advanced Materials, Aug. 2001, pp. 1149-1152, vol. 13, No. 15, Wiley-VCH Verlag GmbH, Weinheim, Germany.

\* cited by examiner

RADIATION-EMITTING DEVICE

This patent application is a national phase filing under section 371 of PCT/DE2008/001329, filed Aug. 12, 2008, which claims the priority of German patent application 10 2007 043 099.1, filed Sep. 10, 2007 and 10 2007 058 453.0, filed Dec. 5, 2007, each of which is incorporated herein by reference in its entirety.

TECHNICAL FIELD

The present invention relates to a radiation-emitting device that has an active area formed for the emission of electromagnetic radiation.

SUMMARY

In one aspect, the invention provides a radiation-emitting device that enables a high radiation outcoupling efficiency of the radiation-emitting device over a long period of time in a simple manner.

The invention is distinguished by a radiation-emitting device having a radiation-emitting component with a layer stack with an active region that is formed for the emission of electromagnetic radiation, and a microstructure layer, mechanically coupled to the layer stack, having elevations that extend away from the layer stack. A protective layer having a planar side facing away from the microstructure layer is arranged on a side of the microstructure layer facing away from the layer structure. The microstructure layer with its elevations serves to achieve a high efficiency, i.e., a high radiation outcoupling.

With its flat-shaped side facing away from the microstructure layer, the protective layer has the advantage that contamination of the radiation-emitting device can be avoided, thus allowing high stability of the radiation outcoupling efficiency from the radiation-emitting device over a long period of time. In addition, the protective layer exerts a protective effect with respect to mechanical stresses such as scuffing.

In an advantageous embodiment, the radiation-emitting device has a substrate that is arranged between the layer stack and the microstructure layer. Thereby the layer stack can be arranged fixedly on the substrate, and thus stably in the radiation-emitting device.

In an additional advantageous embodiment, the radiation-emitting device has a thin film encapsulation that is arranged between the layer stack and the microstructure layer.

In another advantageous embodiment, recesses are formed between the elevations of the microstructure layer, and the protective layer fills up the recesses of the microstructure layer. Thus a simple structure of the protective layer on the microstructure layer is advantageously possible with simple mechanical methods such as casting or coating and/or thermal methods.

In an additional advantageous embodiment of the radiation-emitting device, the protective layer is formed from a material that has an index of refraction, and the substrate or the thin-film encapsulation is formed from a material that has an index of refraction, and the index of refraction of the protective layer is less than or equal to the index of refraction of the substrate or the thin-film encapsulation. This has the advantage that a high external radiation outcoupling efficiency can be assured.

In another advantageous embodiment, the microstructure layer has a material with an index of refraction, and the ratio of the index of refraction of the microstructure layer material to the index of refraction of the protective layer material is greater than or equal to 1.04. This advantageously assures a sufficiently large optical contrast of the protective layer relative to the microstructure layer, and thus a high external radiation outcoupling efficiency.

In another advantageous embodiment, the protective layer is formed from a material that is selected from the group of polymers. This has the advantage that the protective layer can be applied to the microstructure layer by simple mechanical methods such as casting or coating or a thermal method, for example.

In another advantageous embodiment, an intermediate layer is arranged between the microstructure layer and the protective layer. This enables use of protective layers configured as prefabricated plates.

In an additional advantageous embodiment, the intermediate layer is formed from a material having an index of refraction that is less than or equal to the index of refraction of the microstructure layer. This has the advantage that a high external radiation outcoupling efficiency can be assured.

In another advantageous embodiment, the intermediate layer has a vacuum layer. This has the advantage that the intermediate layer has no thermal expansion, or only a very slight one, and does not react to pressure fluctuations from the outside. This enables a low index of refraction of the material in the intermediate layer, and a simple structure of the composite of the substrate, microstructure layer and protective layer.

In another advantageous embodiment, the intermediate layer has a gas that is selected from the group of air, nitrogen, helium, neon, argon, carbon dioxide and fluorinated hydrocarbons. Thereby a simple structure of the composite of the substrate, microstructure layer and protective layer is possible. Additionally, a low index of refraction of the material of the intermediate layer can be achieved.

In another advantageous embodiment, the intermediate layer has a liquid that is selected from the group of water, propanol and heptane. This has the advantage that the intermediate layer has no thermal expansion, or only a slight one, and does not react to pressure fluctuations from the outside. Additionally, a low index of refraction of the material of the intermediate layer can be achieved.

In another advantageous embodiment, the microstructure layer is constructed such that the protective layer contacts the elevations of the microstructure layer, at least in part. This has the advantage that the microstructure layer can mechanically support the protective layer.

In another advantageous embodiment, structural elements are arranged on a side of the protective layer facing the microstructure layer. This has the advantage that the emission of the electromagnetic radiation from the radiation-emitting device can be oriented in a defined manner.

In another advantageous embodiment, the protective layer is constructed as a rigid plate. Thereby a simple structure of the composite of the microstructure layer and the protective layer can be achieved.

In another advantageous embodiment, the protective layer has a thickness between 10 µm and 1000 µm. This allows a thin configuration of the entire radiation-emitting device to be achieved.

In another advantageous embodiment, the protective layer has a thickness between 50 µm and 200 µm. This allows a very thin configuration of the entire radiation-emitting device to be achieved.

In another advantageous embodiment, the microstructure layer is formed from a material having an index of refraction that has a value of up to roughly 1.75. Thereby a high external radiation outcoupling efficiency can be assured.

In another advantageous embodiment, the microstructure layer is formed from a material that is selected from the group of polyimide, polycarbonate and polytetrafluoroethylene. This allows a high index of refraction of the microstructure layer material and a high external radiation outcoupling efficiency of the radiation-emitting device to be achievable.

In another advantageous embodiment, the elevations of the microstructure layer are formed as spherical sections. This has the advantage that the microstructure layer is easily manufactured and can have a regular structure.

In another advantageous embodiment, the elevations of the microstructure layer are formed as pyramids and/or as truncated pyramids. This has the advantage that the microstructure layer is easily manufactured and can have a regular structure.

In another advantageous embodiment, the elevations of the microstructure layer are formed as cones and/or conical sections. This has the advantage that the microstructure layer is easily manufactured and can have a regular structure.

In another advantageous embodiment, the substrate and/or the protective layer has a material that is constructed to be transparent to the electromagnetic radiation that can be emitted by the active region. In this regard, "transparent" means that a transparent element or component is transmissive for at least a subrange of the spectrum of emitted radiation from the radiation-emitting device. Transparent can preferably also mean transmissive for the entire spectrum. This has the advantage that the electromagnetic radiation emitted by the active region can reach outside the radiation-emitting device into an area in which it can be utilized.

In another advantageous embodiment, the substrate and/or the protective layer is formed from a material that is selected from the group of glass, quartz, plastic, plastic with diffusion barrier layers, and metal. Thereby an easily manufactured and inexpensive solution for the substrate and/or the protective layer is possible.

In another advantageous embodiment, the radiation-emitting component is a light-emitting diode. Thereby it is possible to use the protective layer for light-emitting diodes.

In another advantageous embodiment, the radiation-emitting component is an organic light-emitting diode having the active region constructed for the emission of electromagnetic radiation, and the active region has an organic material. Thereby it is possible to use the protective layer for organic light-emitting diodes.

In another advantageous embodiment, the radiation-emitting component is constructed two-dimensionally. In this regard, "two-dimensionally" can mean that the radiation-emitting component extends contiguously over a region that has an area of at least several square millimeters, preferably several square centimeters, and particularly preferably at least one or more square decimeters or more. Thereby it is possible to construct the protective layer for two-dimensionally shaped radiation-emitting components and thus also for very thin radiation-emitting components.

BRIEF DESCRIPTION OF THE DRAWINGS

Advantageous configurations of the invention will be described below on the basis of schematic drawings.

Elements of identical design or function are labeled in all figures with the same reference numbers. The illustrated elements and their size ratios relative to one another are not to be considered true to scale; rather, individual elements, such as layers, components, component elements and regions may be shown exaggeratedly large or thick for the sake of better comprehension.

DETAILED DESCRIPTION OF ILLUSTRATIVE EMBODIMENTS

Figure 1:
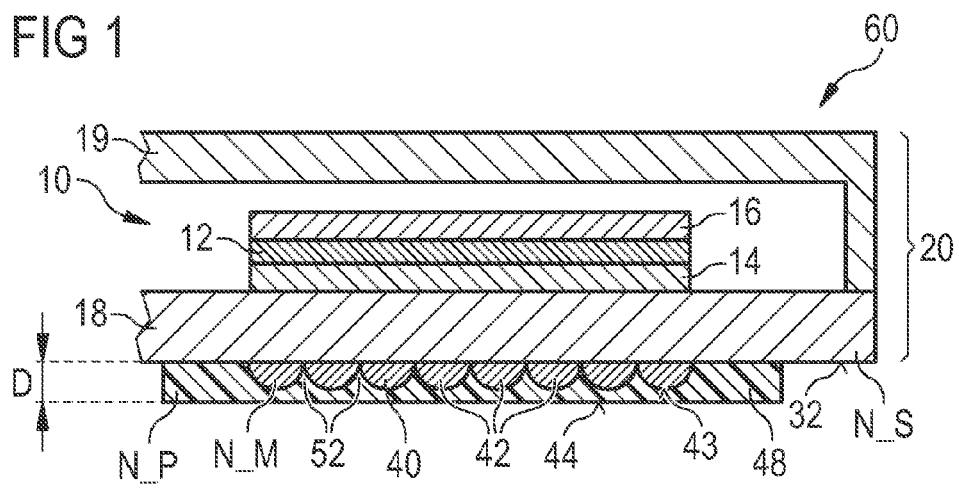
FIG. 1 shows a sectional view of a radiation-emitting device.

A first embodiment of a radiation-emitting device 60 is shown in FIG. 1.

Radiation-emitting device 60 has a radiation-emitting component 20 with a layer stack 10. Layer stack 10 has an active region 12 constructed for the emission of electromagnetic radiation.

Such radiation-emitting devices 60 are preferably constructed in such a manner that the radiation-emitting component 20 is a light-emitting diode or a light-emitting diode array.

It is particularly preferable if radiation-emitting component 20 is constructed as an organic light-emitting diode (OLED). Radiation-emitting components 20 constructed as organic light-emitting diodes are preferably used for display screens (e.g., televisions, PC display screens, displays for automobiles, displays for mobile telephones, touchscreen displays and the like). Large-scale room illumination is another particular field of application.

The active region 12 of the radiation-emitting device 60 constructed as an organic light-emitting diode preferably contains an organic material. Active region 12 can include organic polymers, organic oligomers, organic monomers, small organic non-polymeric molecules ("small molecules") or combinations thereof. Suitable materials for active region 12, as well as arrangements and structuring of the materials, are known to persons skilled in the art and will therefore not be discussed further at this point. Electromagnetic radiation with a single wavelength or a range of wavelengths can be generated in active region 12 by electron and hole recombination. A monochromatic, polychromatic and/or mixed-color illumination effect can be produced for a viewer.

In particular, the electromagnetic radiation produced by active region 12 of radiation-emitting component 20 can have a spectrum with wavelengths in the ultraviolet to the infrared spectral range. It can be particularly favorable if the spectrum includes at least one wavelength visible to an observer. The spectrum of the electromagnetic radiation can also advantageously include several wavelengths, so that a mixed-color illumination can arise for an observer. For this purpose, it is possible for the radiation-emitting component 20 itself to generate electromagnetic radiation with several wavelengths, or for a part of the electromagnetic radiation generated by organic light-emitting component 20, or the entirety of the electromagnetic radiation generated by organic light-emitting component 20, with a first wavelength, perhaps in a blue and/or green spectral range, to be transformed by a wavelength-conversion material into a second wavelength, perhaps in a yellow and/or red spectral range. For this purpose, a layer or a region having a wavelength conversion material can be arranged on the output side of active region 12. Suitable wavelength-conversion materials and layers with wavelength-conversion materials are known to persons skilled in the art in regard to their structure and function and will not be further discussed at this point.

Electrodes 14, 16 are arranged adjacent to active region 12. In particular, electrodes 14, 16 can be planar or structured into subregions. With respect to the figures, electrode 14 is arranged underneath active region 12. Electrode 14 is preferably configured as an anode, whereby it can function as a hole-inducing element.

Electrode 14 is constructed, in particular, as an electrically conductive oxide, a thin transparent metal film or a combination of electrically conductive oxide and thin transparent metal film. The construction of electrode 14 as a transparent electrically conductive oxide (TCO) is especially preferred.

Transparent conductive oxides are transparent conductive materials, as a rule metal oxides such as zinc oxide, tin oxide, cadmium oxide, titanium oxide, indium oxide or, especially preferably, indium-tin oxide (ITO). In addition to binary metal-oxygen compounds such as $ZnO$, $SnO_2$ or $In_2O_3$, the group of transparent conductive oxides also includes ternary metal-oxide compounds such as $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent electrically conductive oxides. Furthermore, the transparent conductive oxides need not correspond to a stochiometric composition, and can also be p-doped or n-doped.

The combination of electrically conductive oxide and thin transparent metal film is particularly preferably formed as a layer sequence of indium-tin oxide (ITO) and the metal (ITO/metal/ITO, IMI).

The electrode 16 that is arranged above active region 12 with respect to the figures is preferably configured as a cathode and thus serves as an electron-inducing element. Alternatively, the electrode 16 above active region 12 is configured as an anode. In particular, aluminum, barium, indium, silver, gold, magnesium, calcium or lithium, as well as compounds, combinations and alloys thereof, can serve advantageously as a material for this electrode.

Layer sequence 10 is arranged on a substrate 18. It is particularly preferred if substrate 18 includes glass. Alternatively or additionally, substrate 18 can also include quartz, plastic films, metal, metal films, silicon wafers or any other desired substrate material. Alternatively or additionally, substrate 18 can also include a laminate or a layer sequence of several layers. At least one of the layers in that case can include glass or consist of glass. Particularly in a substrate 18 formed of a layer sequence, at least the layer on which layer stack 10 is arranged can include glass. Substrate 18 can also include plastic.

Radiation-emitting device 60 further includes a substrate 19 formed as an encapsulation and coupled to substrate 18 in such manner that layer structure 10 with the associated electrodes 14, 16 and active region 12 can be protected from moisture and/or oxidizing substances such as oxygen. Encapsulation 19 can preferably include one or more layers, substrate 19 formed as an encapsulation preferably having planarization layers, barrier layers, water-absorbing and/or oxygen-absorbing layers, connecting layers or combinations thereof.

If radiation-emitting device 60 is thus configured as an organic light-emitting diode and, in particular, as illustrated in FIGS. 1 and 2, as a so-called "bottom emitter," i.e., the radiation emitted in active region 12 radiates out through substrate 18, then substrate 18 can advantageously have a transparency for at least a part of the electromagnetic radiation generated in active region 12. In the "bottom emitter" configuration, electrode 14 formed as an anode can advantageously also have a transparency for at least a part of the electromagnetic radiation generated in active region 12.

A microstructure layer 40 is arranged on a side 32 of substrate 18 facing away from radiation-emitting component 20. Microstructure layer 40 has elevations 42 that extend away from layer stack 10. Recesses 52 are formed between the elevations 42 of microstructure layer 40.

The elevations 42 are advantageously one-dimensional or two-dimensional in shape. One-dimensional elevations 42 are preferably formed trapezoidally, triangularly or as circular segment cross sections. Two-dimensionally structured elevations 42 of microstructure layer 40 are preferably formed as pyramids or truncated pyramids, as cones or truncated cones or as spherical sections. Microstructure layer 40 is preferably formed from a material having an index of refraction N_M. The index of refraction N_M of microstructure layer 40 is preferably up to roughly 1.75. It is especially preferred if microstructure layer 40 is formed from a material that is selected from a group of polyimide, polycarbonate and polytetrafluoroethylene. These materials can have a high index of refraction up to 1.75.

Figure 3:
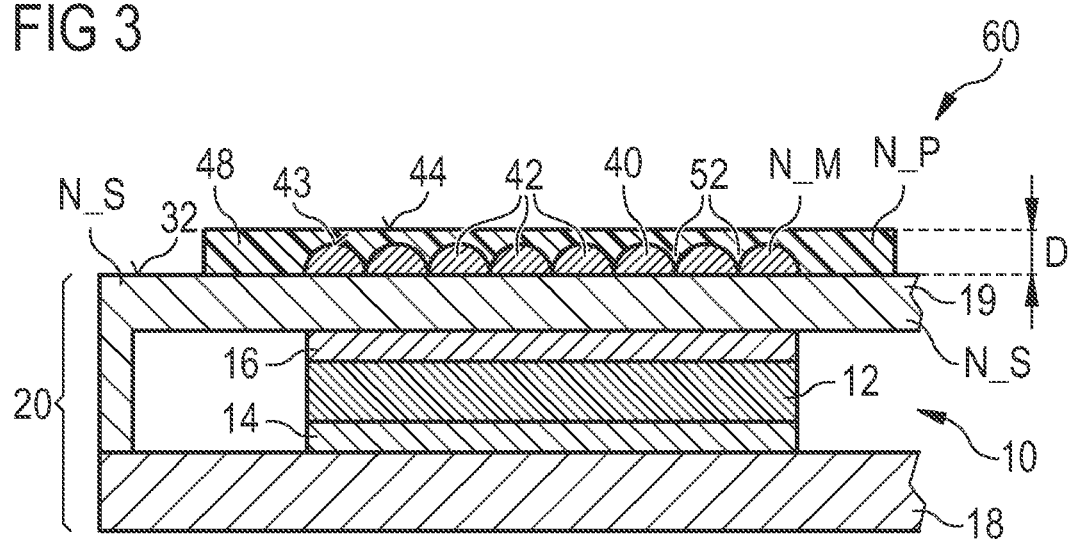
FIG. 3, shows a sectional view of a further embodiment of a radiation-emitting device.

FIG. 3 shows the radiation-emitting device 60 as constructed in the embodiment of FIG. 1, but here the substrate 19 constructed as the encapsulation is arranged between microstructure layer 40 and layer stack 10. Radiation-emitting device 60 is configured as a so-called "top emitter," i.e., the electromagnetic radiation emitted in active region 12 radiates out through the substrate 19 constructed as an encapsulation. The substrate 19 constructed here as an encapsulation advantageously has a transparency for at least a part of the electromagnetic radiation generated in active region 12. In the "top emitter" configuration, the electrode 16 arranged above active region 12 can advantageously have a transparency for at least a part of the electromagnetic radiation generated in active region 12.

If at least one of the electrodes 14, 16 that includes or consists of the layer of electrically conductive oxide, thin transparent metal film or combination of electrically conductive oxide and thin transparent metal film is to be configured to be transparent to the light emitted from the organic layer stack 10, then it can be advantageous if this layer is formed sufficiently thinly. The thickness of such a semitransparent layer preferably lies between 1 nm and 100 nm, including the boundaries.

Microstructure layer 40 has a side 43 facing away from layer stack 10, on which side a protective layer 48 is arranged. Protective layer 48 has a planar side 44 that faces away from microstructure layer 40.

By means of the planar construction of the side 44 of protective layer 48 that faces away from microstructure layer 40, it is possible for radiation-emitting device 60 to be formed with a smooth surface, so that contamination of radiation-emitting device 60 can be avoided with particular ease. In addition, the handling of radiation-emitting device 60 is simplified, since the flat side 44 facing away from microstructure layer 40 can be insensitive to mechanical influences. This applies, in particular, even if radiation-emitting device 60 is used in more advanced applications, for example, by mounting on a mechanical support.

In the embodiments shown in FIGS. 1 and 3, protective layer 48 fills in the recess 52 of microstructure layer 40. Protective layer 48 here is preferably formed from a material that has an index of refraction N_P, and substrate 18 is formed from a material that has an index of refraction N_S. The index of refraction N_P of protective layer 48 is preferably less than or at most equal to the index of refraction N_S of substrate 18. This can have the effect that radiation-emitting device 60 achieves a high external radiation outcoupling efficiency.

If microstructure layer 40 includes a material with index of refraction N_M and if the ratio of the index of refraction N_M of the material of microstructure layer 40 to the index of refraction N_P of the material of protective layer 48 is greater than or equal to 1.04, then a good optical contrast between microstructure layer 40 and protective layer 48 can be achieved. Thereby it is possible for a high external radiation outcoupling efficiency of radiation-emitting device 60 to be achieved It is particularly preferable if protective layer 48 is formed from a material that is selected from the group of polymers, and microstructure layer 40 is formed with a material that is a polyimide. Since the index of refraction of polymers lies in the range from 1.4 to 1.55 and the index of refraction of polyimides is markedly higher, a particularly good optical contrast can be achieved between microstructure layer 40 and protective layer 48, and thus a particularly high radiation outcoupling efficiency from radiation-emitting device 60.

Figure 2A:
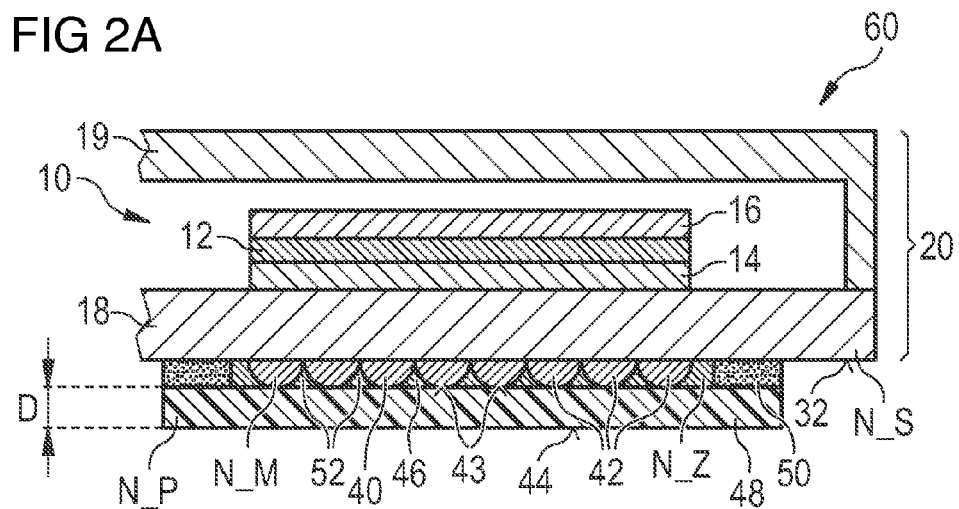
FIGS. 2A and 2B, show sectional views of further embodiments of a radiation-emitting device.
Figure 2B:
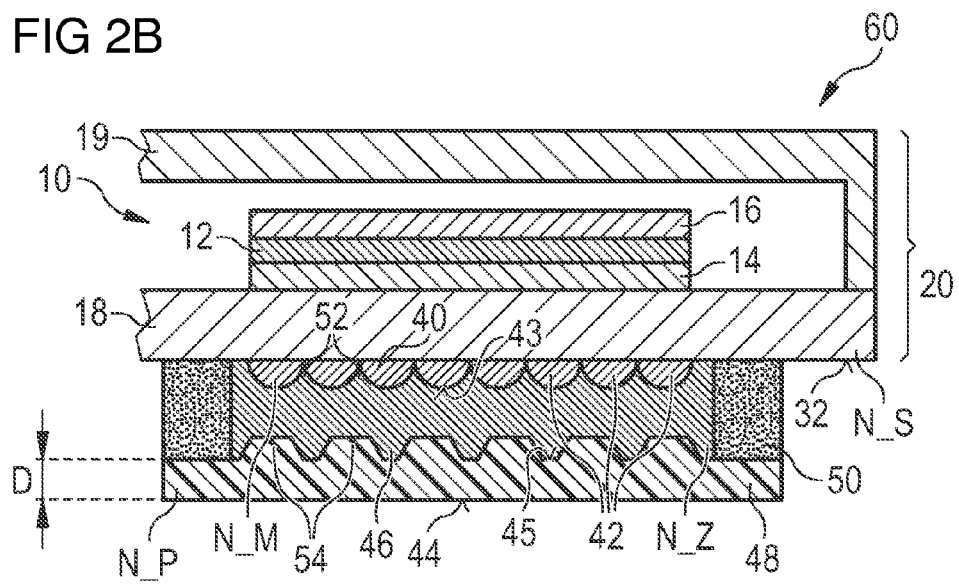

FIGS. 2A and 2B show embodiments of radiation-emitting device 60 with the microstructure layer 40 and the protective layer 48, in which the device 60 has an intermediate layer 46 arranged between microstructure layer 40 and protective layer 48.

It is particularly preferred if protective layer 48 is constructed as a rigid plate. In that way it is very easy to achieve a stable composite of microstructure layer 40 and protective layer 48. In the embodiment shown here, protective layer 48 is fixedly coupled mechanically to substrate 18 by means of an adhesive layer 50. Thereby a particularly stable construction of the composite of protective layer 48, microstructure layer 40 and substrate 18 can be achieved.

If intermediate layer 46 is formed from a material with an index of refraction N_Z that is less than or equal to the index of refraction N_M of microstructure layer 40, a particularly high radiation outcoupling efficiency from radiation-emitting device 60 can be achieved.

This can be achieved particularly well if intermediate layer 46 is a vacuum layer. Since the index of refraction of a vacuum is equal to 1, a particularly high radiation outcoupling efficiency from radiation-emitting device 60 can be achieved.

In an additional embodiment, intermediate layer 46 can be filled with a gas, particularly preferably with air, nitrogen, carbon dioxide, helium, neon, argon or a fluorinated hydrocarbon. These gases are particularly stable chemically and have a low index of refraction, generally near 1. This allows a particularly high radiation outcoupling efficiency from radiation-emitting device 60 to be achieved.

In additional embodiments, intermediate layer 46 is filled with a liquid, with water, propanol and heptane being particularly preferred. For these fluids, only small thermal and pressure-dependent expansions of intermediate layer 46 are achieved. The fluids additionally have a low index of refraction. Here too, a particularly high radiation outcoupling efficiency from radiation-emitting device 60 can be achieved.

In the embodiment of FIG. 2A, protective layer 48 contacts the elevations 42 of microstructure layer 40 in part. Thereby microstructure layer 40 serves as a support layer for protective layer 48.

In another preferred embodiment (FIG. 2B), protective layer 48 can also be distant from microstructure layer 40.

It is particularly preferred if structure elements 54 are arranged on a side 45 of protective layer 48 that faces microstructure layer 40 (FIG. 2B). Structure elements 54 of protective layer 48 are preferably constructed as pyramids, prisms, cones or spherical sections, each of which can also be structured two-dimensionally. Thereby the emission of electromagnetic radiation from the radiation-emitting device can be oriented in a defined manner.

Protective layer 48 is formed from a material that is configured to be transparent to the electromagnetic radiation that can be emitted by active region 12. Protective layer 48 can be formed from a material including glass, quartz or a transparent plastic. Protective layer 48 can also consist of glass, quartz or a transparent plastic.

Protective layer 48 preferably has a thickness D between 10 μm and 1000 μm. Thereby it is possible to construct radiation-emitting device 60 to be thin. It is especially preferable if the protective layer 48 has a thickness D between 50 μm and 200 μm, since this allows radiation-emitting device 60 can be constructed to be very thin.

If protective layer 48 of the embodiment in FIG. 2B comprises a glass plate, it is preferred that the thickness D of protective layer 48 be roughly 700 μm. The protective layer 48 made of a glass plate with a thickness D of roughly 700 μm is easily manipulated, and protective layer 48 also contributes only insubstantially to an overall thickness of radiation-emitting device 60. Thus it is possible for the value of the outcoupled light power of radiation-emitting device 60 for a protective layer 48 configured in this manner to be reduced by only a few percent relative to the radiation-emitting device 60 without protective layer 48.

Radiation-emitting component 20 is preferably constructed two-dimensionally.

Radiation-emitting device 60 can additionally include optical elements that are arranged on the output side of active region 12 in the emission direction of the electromagnetic radiation. In particular, perhaps on the exterior side of substrate 18 (for a "bottom emitter") or on top of substrate 19 configured as an encapsulation (for a "top emitter"), it is possible to arrange a circular polarizer, with which it is advantageously possible to prevent light that is irradiated from the exterior into radiation-emitting device 60 and can be reflected at electrodes 14, 16, for example, from again exiting from radiation-emitting device 60.

Alternatively, radiation-emitting component 20 can be constructed as an electroluminescent film. In this case, an active region that includes an inorganic material, zinc sulfide, for example, can be arranged between two electrodes. These electrodes can also have characteristics and structures of the type that were described in connection with the organic radiation-emitting components 20. The active region can have a suitable dopant, e.g., copper or europium.

Due to the already illustrated advantages of a long service life with high radiation outcoupling, the above-described radiation-emitting devices 60 can enable high economic efficiency and low costs. In particular, low contamination and therefore low cleaning costs can be achieved. Due to the large degree of insensitivity of the surface to mechanical stresses, a good further processing of radiation-emitting device 60 can become possible.

Such radiation-emitting devices 60 can be suitable for use in display and/or lighting units that are distinguished by a compact, space-saving and thin overall shape.

The description with reference to exemplary embodiments does not limit the invention thereto. Rather, the invention includes every novel characteristic as well as every combination of characteristics, which includes, in particular, every combination of characteristics in the claims, even if this characteristic or this combination is not explicitly specified in the claims or exemplary embodiments.

The invention claimed is:

1. A radiation-emitting device comprising:
   a radiation-emitting component with a layer stack with an active region that is constructed for emission of electromagnetic radiation;

a microstructure layer, mechanically coupled to the layer stack, the microstructure layer having elevations extending away from the layer stack;

a protective layer having a planar side facing away from the microstructure layer, the protective layer arranged on a side of the microstructure layer facing away from the layer stack;

an intermediate layer between the microstructure layer and the protective layer; and structure elements arranged on a side of the protective layer that faces the microstructure layer.

2. The radiation-emitting device according to claim 1, wherein the intermediate layer is formed from a material that has an index of refraction that is less than or equal to an index of refraction of the microstructure layer.

3. The radiation-emitting device according to claim 1, wherein the intermediate layer comprises a liquid selected from the group consisting of water, propanol and heptane.

4. The radiation-emitting device according to claim 1 claim 5, wherein the protective layer contacts the elevations of the microstructure layer at least in part.

5. The radiation-emitting device according to claim 1, wherein the protective layer comprises a rigid plate.

6. The radiation-emitting device according to claim 1, wherein the protective layer has a thickness between 10 μm and 1000 μm.

7. The radiation-emitting device according to claim 1, wherein the microstructure layer comprises a material having an index of refraction that has a value of up to about 1.75.

8. The radiation-emitting device according to claim 1, wherein the microstructure layer comprises a material selected from the group consisting of polyimide, polycarbonate and polytetrafluoroethylene.

9. The radiation-emitting device according to claim 1, wherein the elevations of the microstructure layer are formed as pyramids and/or as truncated pyramids and/or as cones and/or truncated cones and/or as spherical sections.

10. The radiation-emitting device according to claim 1, wherein the intermediate layer is a vacuum layer.

11. The radiation-emitting device according to claim 1, wherein the protective layer comprises a material that is transparent for the electromagnetic radiation emitted by the active region.

12. The radiation-emitting device according to claim 1, wherein the emission of the electromagnetic radiation from the radiation-emitting device is oriented in a manner defined by the structural elements.

13. The radiation-emitting device according to claim 1, further comprising recesses between the elevations of the microstructure layer, wherein the protective layer fills the recesses.

14. The radiation-emitting device according to claim 13, wherein the protective layer is formed from a material having a first index of refraction, the radiation-emitting device further comprising a substrate or a thin-film encapsulation arranged between the layer stack and the microstructure layer, the substrate being formed from a material having a second index of refraction, the first index of refraction being less than or equal to the second index of refraction.

15. The radiation-emitting device according to claim 14, wherein the microstructure layer comprises a material with a third index of refraction, a ratio of the third index of refraction to the first index of refraction is greater than or equal to 1.04.

16. The radiation-emitting device according to claim 14, wherein the substrate is arranged between the layer stack and the microstructure layer.

17. The radiation-emitting device according to claim 14, wherein the substrate comprises a material that is transparent for the electromagnetic radiation emitted by the active region.

18. The radiation-emitting device according to claim 17, wherein the protective layer comprises a material that is transparent for the electromagnetic radiation emitted by the active region.

* * * * *

UNITED STATES PATENT AND TRADEMARK OFFICE
CERTIFICATE OF CORRECTION

| | | |
|---|---|---|
| PATENT NO. | : 8,253,155 B2 | Page 1 of 1 |
| APPLICATION NO. | : 12/677085 | |
| DATED | : August 28, 2012 | |
| INVENTOR(S) | : Krummacher et al. | |

It is certified that error appears in the above-identified patent and that said Letters Patent is hereby corrected as shown below:

In the Claims:

In Col. 9, line 20, claim 4, delete "claim 5".

Signed and Sealed this
Twenty-third Day of April, 2013

Teresa Stanek Rea
*Acting Director of the United States Patent and Trademark Office*